United States Patent [19]

Brorby

[11] Patent Number: 5,539,252

[45] Date of Patent: Jul. 23, 1996

[54] FASTENER WITH ONBOARD MEMORY

[75] Inventor: Michael J. Brorby, Redmond, Oreg.

[73] Assignee: MacSema, Inc., Bend, Oreg.

[21] Appl. No.: 441,929

[22] Filed: May 16, 1995

[51] Int. Cl.$^6$ .......................... H01L 23/02; H01L 23/48; H01L 23/52

[52] U.S. Cl. .......................... 257/678; 257/690; 257/692; 257/924; 365/226; 365/228; 365/229; 361/728; 361/729; 340/825.31

[58] Field of Search ..................... 257/678, 688, 257/689, 690, 692, 698, 699, 687, 704, 710, 798, 924; 361/392, 394, 401, 395, 300; 340/825.31; 365/229, 228, 226; 368/203, 205, 204

[56] References Cited

U.S. PATENT DOCUMENTS

| | | |
|---|---|---|
| 3,996,735 | 12/1976 | Zurcher . |
| 4,578,573 | 3/1986 | Flies et al. . |
| 4,752,911 | 6/1988 | Prevost et al. . |
| 4,860,228 | 8/1989 | Carroll . |
| 4,868,409 | 9/1989 | Tanaka et al. . |
| 4,965,828 | 10/1990 | Ergott, Jr. et al. . |
| 4,982,371 | 1/1991 | Bolan et al. . |
| 4,999,742 | 3/1991 | Stampfli . |
| 5,001,670 | 3/1991 | Slate et al. . |
| 5,058,074 | 10/1991 | Sakamoto . |
| 5,070,500 | 12/1991 | Horinouchi et al. . |
| 5,091,771 | 2/1992 | Bolan et al. . |
| 5,163,025 | 11/1992 | Chamberlain . |
| 5,173,876 | 12/1992 | Kawashima et al. . |
| 5,191,554 | 3/1993 | Lee . . |
| 5,196,374 | 3/1993 | Hundt et al. . |
| 5,197,026 | 3/1993 | Butler . |
| 5,206,938 | 4/1993 | Fujioka . |

*Primary Examiner*—Sara W. Crane
*Assistant Examiner*—Carl Whitehead, Jr.
*Attorney, Agent, or Firm*—Kolisch, Hartwell, Dickinson, McCormack & Heuser

[57] ABSTRACT

A fastener is provided with onboard memory in the form of a non-volatile memory device. The fastener defines a casing with an elongate body and a transverse gripping head, such casing defining a bore into which the nonvolatile memory device is placed. The memory device is mounted on a circuit board having a first side which defines a plurality of electrically conductive contacts for use in communicating with the memory device. The electrically conductive contacts are selectively exposed to provide access to the memory device. The other side of the circuit board is placed inside the casing and covered with potting material. Simple wiring on the small board, using through-hole vias, suffices to route power, ground, and data lines to the memory device, while providing a sealed durable package with at least three external contacts and fastening capabilities.

19 Claims, 1 Drawing Sheet

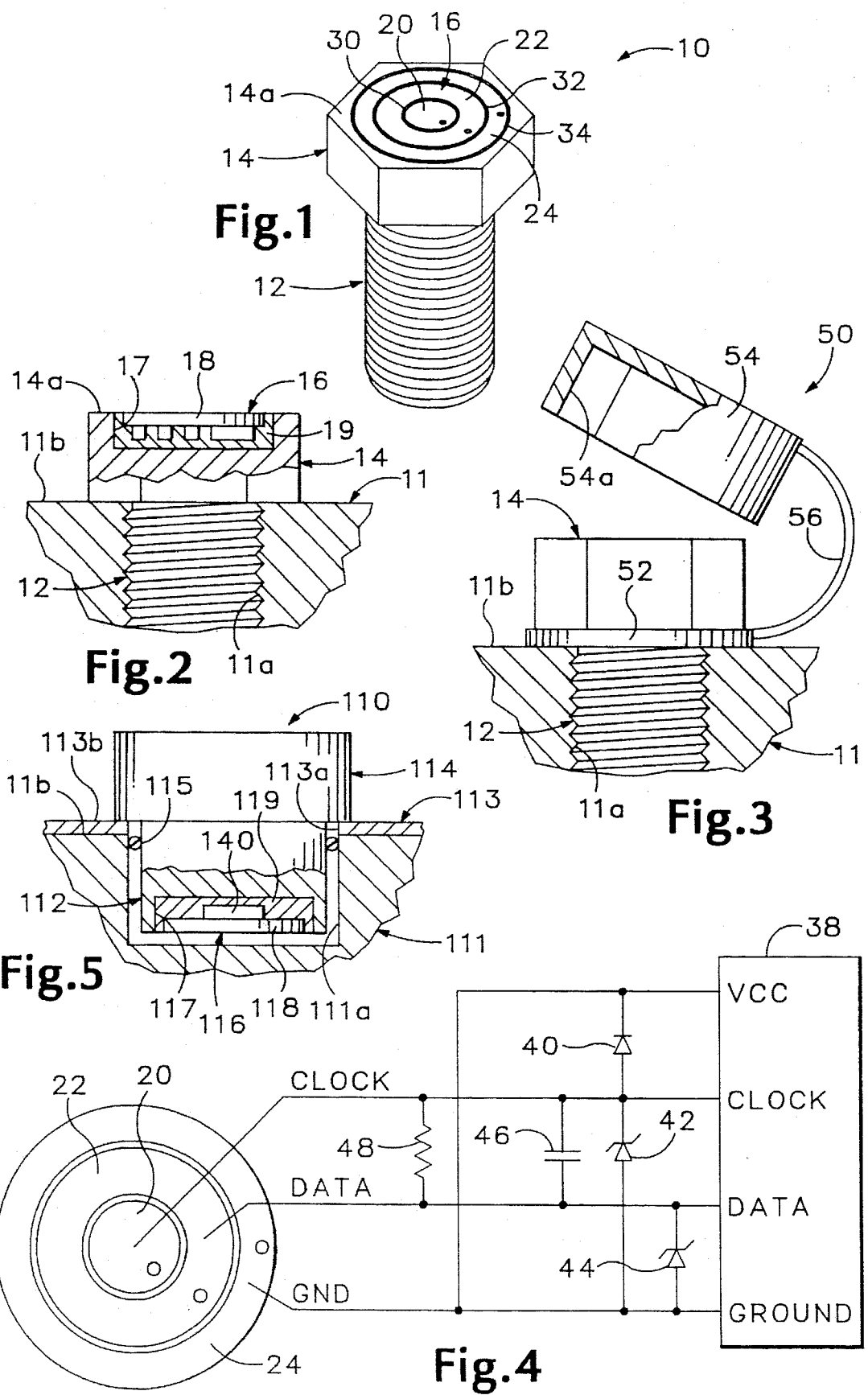

FASTENER WITH ONBOARD MEMORY

TECHNICAL FIELD

The present invention relates generally to fasteners, and more particularly, to a fastener with an onboard electronic data module. More particularly still, the invention concerns a fastener which employs a nonvolatile memory device.

BACKGROUND ART

One of the long-term goals in electronics technology has been to provide higher functionality at a lower cost, and in a more convenient package. Electronic data modules are no different. There is a constant struggle to increase memory capacity and access speed, while at the same time decreasing module cost and size. Similarly, manufacturers have struggled to identify a package which may be used without disrupting the utility of the apparatus in connection with which the data module is used. This has led to smaller data modules, and to a variety of unique casing designs. The innovations disclosed herein are believed to contribute to a major advance in this direction.

As a result of the aforementioned trend toward compactness, data modules have been constructed using integrated circuit technology, and using very small casings which provide contacts whereby such data modules may be accessed. Current modules, however, have not met commercial expectations, particularly in the areas of reliability, package utility and module life. Data often is lost or miscommunicated due to dead batteries, or to poor electrical connections within the module itself. Further, many data modules are unsuitable for inconspicuous mounting, and may be unsuitable for mounting at all. The data module disclosed in U.S. Pat. No. 4,982,371 to Bolan et al., for example, has many limiting features, including limitations related to the use of onboard battery power, to its coin-like package and to the abundance of electrical connections between module components.

Further, the Bolan module employs an onboard battery, the module life thus extending only as long as the battery life. Once the battery voltage deteriorates to a point that the memory loses data, the module is no longer useful. Because all batteries self discharge, it will be understood that failure of the module and a loss of the data contained therein will eventually result. Additionally, the rate of battery discharge may be accelerated by various factors, including the number of transactions that the module performs, the temperature, and the RAM memory size. Further, because batteries generally include hazardous materials such as lithium and mercury, the Bolan data module may be environmentally unsafe.

The casing of the Bolan module also is unsuitable, it being difficult to mount or attach the module to physical items. The Bolan module's casing, it will be noted, is divided into first and second casing halves. This two-part casing makes it difficult to "pot" internal components, a procedure often used to ensure that all electrical connections are secure. The Bolan module instead relies on an elastic conductive material which applies pressure to contact points on the first and second casing halves. Potting material must be kept clear of these contact points. This is accomplished by pouring potting material into one-half of the casing, and then fitting the other half of the casing over the first casing half. If too much potting material is poured into the first casing half, an open contact can result. If too little potting material is poured into the first casing half, the casing can be partially crushed during use. Also, potting material can surround the elastic conductive material, thus reducing the amount of pressure the elastic conductive material exerts on the contact points.

SUMMARY OF THE INVENTION

The present invention concerns a fastener which has been fitted with an onboard electronic data module having a nonvolatile memory device. The fastener is formed with a data module mounting arrangement, preferably in the form of a recess or bore. The fastener thus defines a casing in which the data module may be housed. In one embodiment, the recess is formed in the gripping head of the fastener. In another embodiment, the recess is formed in the fastener body and thus hidden from view. The memory device is mounted on a printed circuit board, which in turn is potted in the data module recess so as to cover the memory device, but expose contact areas which connect to the integrated circuit's data, clock and ground lines. The three contact areas are isolated from one another, each serving as a contact for connection to a host system which communicates data to and from the module. The module receives power through its signal lines using an innovative Powered I squared C (PIIC) bus protocol.

These and additional objects and advantages of the present invention will be more readily understood after a consideration of the drawings and the detailed description which follows.

BRIEF DESCRIPTION OF THE DRAWINGS

FIG. 1 is an isometric view of a fastener employing an electronic data module in accordance with a preferred embodiment of the invention.

FIG. 2 is a fragmentary side sectional view of the fastener and corresponding electronic data module shown in FIG. 1.

FIG. 3 is a side view of the fastener shown in FIG. 1, such fastener having been fitted with an electronic data module cover which is shown in fragmented section.

FIG. 4 is a schematic diagram of the electronic data module depicted in FIGS. 1 and 2.

FIG. 5 is a fragmentary side sectional view of a fastener and corresponding electronic data module constructed in accordance with an alternative embodiment of the invention.

DETAILED DESCRIPTION AND BEST MODE FOR CARRYING OUT THE INVENTION

Referring initially to FIGS. 1 and 2, the reader will note that a fastener having characteristics of a somewhat conventional hex-bolt is shown at 10, such fastener being constructed in accordance with a preferred embodiment of the present invention. As indicated, fastener 10 includes an elongate threaded shaft 12, and a hexagonal gripping head 14 which may be used to drive the fastener into a threaded hole 11a of a reference structure 11. The fastener's gripping head rests against the reference structure's surface 11b. Threaded shaft 12 may be used simply to hold the fastener within hole 11a, or may be used to secure another structure to structure 11. Those skilled will, of course, appreciate that fastener 10 may take various forms, including, for example, that of a screw or a plug fastener.

In accordance with the present invention, fastener 10 is configured to receive an electronic data module 16 which carries information to be accessed by a host system (not shown). In the depicted embodiment, gripping head 14 provides the housing for the data module, such head defining an elongate internal bore or recess 17 wherein the data module may be placed. The chosen bore diameter preferably is approximately 0.64-inches. The depth of the bore typically is on the order of approximately 0.20-inches.

The electronic data module is embodied by a circuit which is mounted on a rigid, generally planar printed circuit board 18, such circuit board being formed to fit somewhat closely within bore 17. As indicated, the printed circuit board lies flush with surface 14a of head 14, exposing a first side with an etched surface forming conductive concentric circles 20, 22, 24 thereon. The conductive circles are electrically isolated from each other, and from the fastener itself, by nonconductive insulation circles 30, 32, 34 so as to provide first, second and third distinct electrical contact surfaces. Insulation circles 30 and 32 are defined by circuit board etching. Insulation circle 34 is defined by nonconductive potting material 19 which acts as an adhesive to secure the data module within the bore. Simple wiring on the circuit board, using through-hole vias (indicated by circles in FIGS. 1 and 4), electronically connects the conductive circles to components mounted on the printed circuit board.

As indicated above, the potting material 19 is used to hold the data module in place. Such potting material generally is poured into bore 17 and then covered by circuit board 18. The components on the printed circuit board face downwardly into the bore and thus are electrically isolated by the potting material. The circuit board is pushed down until it lies flush with surface 14a, excess potting material being passed between the circuit board and the bore perimeter and then simply wiped away.

An electronic data module such as that employed by fastener 10 can be used in several ways. Such module may, for example be used for inventory control, machinery maintenance records, or retail tagging. It thus is often desirable to mount a data module on a physical item to which the information in the data module relates. In such a situation, the data module generally will be mounted via fastener 10 so that all three of the data module's electrical contacts can be reached by the user. This generally means that the fastener is secured to a surface on the item in connection with which the module provides data. Fasteners thus may serve a dual purpose, acting both to provide for a structural combination, and to provide for data to a user thereof. One common use of such a fastener is in a vehicle body where the fastener can provide maintenance information and the like. Another use involves the tracking of cargo in a carrier such as a ship, a train or a truck.

Referring now to the electronics of the depicted data module, it is to be noted that such electronics are mounted on the module's circuit board preferably on a second side facing the interior of bore 17. As indicated in FIG. 4, the electronics includes an integrated circuit 38 which acts as the module's memory device, and several discrete components electrically connected in the arrangement shown. Memory device 38 is preferably a Microchip 24LC02, but a variety of other memory devices similarly may be used. In the presently preferred embodiment the following component part numbers, or values, are assigned to the remaining components of the data module. Resistor 48 has a resistance of 47K ohms. Zener diode 42 and zener diode 44 are selected as part number 1N5233B diodes. Capacitor 46 has a capacitance of 0.22 uF. Rectifier diode 40 is selected as part number 1N4001 diodes.

A host system (not shown) selectively connects to the fastener to communicate with the data module to acquire the information contained therein. The host system also may be directed to write to the data module, or even to clear the information held thereby. In the preferred embodiment the host system connects to the data module using a plurality of pogo pins which are configured to engage the electrical contacts 20, 22, 24. The host system includes a host microprocessor, such microprocessor being configured to read data from the module and write data to the module via a circuit which includes clock and data signal lines (see FIG. 4). Such clock and data lines connect the data module's contacts respectively to clock and data pins. Similarly, a ground line connects the remaining contact to a ground pin of the data module. A more particular description of the host system is provided in U.S. patent application Ser. No. 08/076,236, which is entitled COMPACT ELECTRONIC DATA MODULE WITH NONVOLATILE MEMORY, and which is commonly owned herewith. The disclose of that application is hereby incorporated in this disclosure by this reference thereto.

To communicate with the data module the host system uses a modified version of a Phillips Electronics I squared C (IIC) bus. Full documentation of the conventional I squared C bus is available from Phillips Electronics. The modified bus structure is innovative in that the clock and data lines power the electronic data module. Consequently, no power line is required with the modified (PIIC) bus. The IIC bus limits bus capacitance to 400 pF on the clock and data lines. There is no limit on the clock line capacitance with the PIIC bus. The IIC bus limits the maximum high level input current at 90% Vdd for both clock and data pins to 10 uA. There is no limit on the high level input current at 90% Vdd for clock current with the PIIC bus. The bus clock is limited to 100 kHz on the IIC bus. The PIIC bus does not have a limit on the bus clock. The preferred embodiment of the electronic data module uses up to a 400 kHz bus dock.

The PIIC bus also provides a simple method where a host can power and communicate with a electronic data module using two signal lines. These signal lines are designated CLOCK and DATA in FIG. 4. The host has a very low impedance source driver with a pull down resistor on the clock line. The clock line thus can provide sufficient current, while in a high state, to power the electronic data module and also charge a capacitor in the electronic data module. When the clock line is in a low state, the electronic data module draws power from the onboard capacitor that was charged during the high state.

FIG. 3 shows an electronic data module cover 50 for use in connection with fastener 10, such cover being configured to avoid damage to the data module which is embedded in the fastener's head. As indicated, cover 50 may be secured to the fastener 10 via a washer portion 52 through which threaded body 12 of fastener 10 may pass. Washer portion 52 thus is held between head 14 and reference surface 11b as shown. A cap portion 54 then may be applied over head 14, such cap portion being defined with a recess 54a shaped correspondingly to head 14. A strap, or hinge, 56 secures cap portion 54 to washer portion 52 such that the cap portion may readily be removed without potential loss.

In an alternative embodiment of the invention, shown in FIG. 5, the fastener takes the form of a plug fastener 110, such fastener including a friction-fit body 112, and a circular gripping head 114. The depicted plug fastener is configured for attachment to a reference structure 111, the fastener being frictionally held in a hole 111a. The fastener passes through a secondary structure 113 to structure 111, structure 113 defining a hole 113a which is shaped similarly to hole IIa. Secondary structure 113 thus may be held against a surface 111b of reference structure 111, the plug's head 114 engaging a surface 113b of structure 113. An internal O-ring 115 provides for tight-fitting securement of the plug.

Unlike the fastener depicted in FIGS. 1–4, fastener 110 is provided with a bore 117 in its body 112, such bore providing for receipt of a data module 116. The data module includes a nonvolatile memory device which is mounted on a circuit board 118. Circuit board 118 is provided with concentric electrical contacts similar to those shown in FIG. 1. The data module is held within bore 117 by potting material 119, the printed circuit board being inserted in a manner similar to that described above.

Also, the diodes, capacitor, resistor and memory device of data module 116 all are incorporated into a single integrated circuit 140. The integrated circuit 140 is mounted on printed circuit board 118 which differs principally from circuit board 18 in that its through-hole vias are designed to accommodate integrated circuit 140. A host system similar to that described above may be used to communicate with the memory device.

While the present invention has been shown and described with reference to the foregoing preferred embodiment, it will be apparent to those skilled in the art that various changes in form and detail may be made without departing from the spirit and scope of the invention as defined by the claims.

I claim:

1. A fastener with onboard memory configured for selected securement to a reference structure, said fastener comprising:

a casing including an elongate body and a gripping head whereby said casing is secured to the reference structure, said casing defining an elongate internal bore;

a nonvolatile memory device; and a generally planar circuit board having a first side with a plurality of electrically conductive contact surfaces, and a second side which mounts said nonvolatile memory device in a determined electrical relation with said contact surfaces;

said circuit board being installed within said internal bore such that said contact surfaces are substantially exposed for periodic electrical access of said nonvolatile memory device.

2. The fastener of claim 1, wherein said contact surfaces are concentrically arranged.

3. The fastener of claim 1, wherein said nonvolatile memory device is selectively powered via said contact surfaces.

4. The fastener of claim 1, wherein said contact surfaces connect to clock and data pins of said nonvolatile memory device.

5. The fastener of claim 4, wherein said nonvolatile memory device is selectively powered via clock and data input lines.

6. The fastener of claim 1, wherein said bore is defined in said gripping head.

7. The fastener of claim 6, wherein said head defines a generally planar head surface, said circuit board being mounted with said contact surfaces generally flush with said head surface.

8. The fastener of claim 7, wherein said bore holds a potting material, said second side of said circuit board being set in said potting material.

9. The fastener of claim 1, wherein said bore is defined in said elongate body.

10. The fastener of claim 9, wherein said bore holds a potting material, said second side of said circuit board being set in said potting material.

11. The fastener of claim 1, wherein said elongate body is threaded.

12. The fastener of claim 1, wherein said casing is a threaded hex-bolt.

13. The fastener of claim 1 which further comprises a data module cover with a cap portion having a recess which closely conforms to said gripping head.

14. The fastener of claim 13, wherein said data module cover is secured to said casing via a strap which connects said cover to a washer portion through which said elongate body passes.

15. A fastener with onboard memory, said fastener comprising:

an unitary casing having an elongate threaded body and a transverse gripping head with a bore which extends inwardly from an exposed, generally planar head surface;

a generally planar circuit board having first and second sides, said first side defining a plurality of electrically conductive contact surfaces, said circuit board being installed within said bore such that said first side is generally flush with said exposed head surface; and a nonvolatile memory device mounted on said second side of said circuit board, said nonvolatile memory device including a clock pin electrically connected to a first one of said contact surfaces for selected connection to a clock signal line, a data pin electrically connected to a second one of said contact surfaces for selected connection to a data signal line, and a ground pin electrically connected to a third one of said contact surfaces for selected connection to a common ground, said nonvolatile memory device being powered via said signal lines during periodic electrical access of said nonvolatile memory device.

16. The fastener of claim 15, wherein said contact surfaces are concentrically arranged.

17. The fastener of claim 15, wherein said second side of said circuit board is set in an electrically insulative potting material.

18. The fastener of claim 15 which further comprises a data module cover with a cap portion having a recess which closely conforms to said gripping head.

19. The fastener of claim 18, wherein said data module cover is secured to said casing via a strap which connects said cover to a washer portion through which said elongate body passes.

* * * * *